(12) United States Patent
Toi (10) Patent No.: US 9,306,046 B2
(45) Date of Patent: Apr. 5, 2016

(54) SEMICONDUCTOR DEVICE HAVING A SEMICONDUCTOR ELEMENT AND A TERMINAL CONNECTED TO THE SEMICONDUCTOR ELEMENT

(75) Inventor: Shigeo Toi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/359,042

(22) PCT Filed: Feb. 22, 2012

(86) PCT No.: PCT/JP2012/054294
§ 371 (c)(1),
(2), (4) Date: May 16, 2014

(87) PCT Pub. No.: WO2013/124989
PCT Pub. Date: Aug. 29, 2013

(65) Prior Publication Data
US 2015/0303287 A1   Oct. 22, 2015

(51) Int. Cl.
*H01L 29/739* (2006.01)
*H01L 23/492* (2006.01)
(Continued)

(52) U.S. Cl.
CPC .......... *H01L 29/7395* (2013.01); *H01L 23/488* (2013.01); *H01L 23/492* (2013.01); *H01L 23/49811* (2013.01); *H01L 24/33* (2013.01); *H01L 25/07* (2013.01); *H01L 25/18* (2013.01); *H01L 29/0696* (2013.01); *H01L 29/1004* (2013.01); *H01L 29/1608* (2013.01); *H01L 29/2003* (2013.01); *H01L 29/41708* (2013.01); *H01L 29/7396* (2013.01); *H01L 24/29* (2013.01); *H01L 24/32* (2013.01); *H01L 25/072* (2013.01); *H01L 2224/291* (2013.01);
(Continued)

(58) Field of Classification Search
None
See application file for complete search history.

(56) References Cited

U.S. PATENT DOCUMENTS

2008/0173893 A1    7/2008  Hamaguchi et al.
2010/0264546 A1*  10/2010  Torii .................. H01L 24/03
                                                              257/773

FOREIGN PATENT DOCUMENTS

JP    2004-363327 A    12/2004
JP    2006-120933 A     5/2006
(Continued)

OTHER PUBLICATIONS

International Search Report; PCT/JP2012/054294; Apr. 17, 2012.
(Continued)

*Primary Examiner* — Shaun Campbell
*Assistant Examiner* — Aneta Cieslewicz
(74) *Attorney, Agent, or Firm* — Studebaker & Brackett PC (57) ABSTRACT

A semiconductor device includes a semiconductor element with a plurality of gates, an emitter pattern insulated from the plurality of gates and an emitter electrode formed on the emitter pattern, the semiconductor element being formed such that a main current flows into the emitter electrode via the emitter pattern, a first solder formed on a part of the emitter electrode, a second solder formed on a part of the emitter electrode apart from the first solder, and a terminal connected to the emitter electrode by means of the first solder and the second solder, wherein the semiconductor element includes a first solder region, a second solder region and an intermediate region, a density of the gates in each of the solder regions are equal, and a current density of the main current in the intermediate region is lower than current densities of the main currents in the other solder regions.

10 Claims, 6 Drawing Sheets (51) Int. Cl.
*H01L 23/498* (2006.01)
*H01L 23/00* (2006.01)
*H01L 29/06* (2006.01)
*H01L 25/07* (2006.01)
*H01L 25/18* (2006.01)
*H01L 23/488* (2006.01)
*H01L 29/10* (2006.01)
*H01L 29/16* (2006.01)
*H01L 29/20* (2006.01)
*H01L 29/417* (2006.01)

(52) U.S. Cl.
CPC .......... *H01L2224/32245* (2013.01); *H01L 2224/3313* (2013.01); *H01L 2224/33106* (2013.01); *H01L 2224/33134* (2013.01); *H01L 2924/13055* (2013.01); *H01L 2924/13091* (2013.01)

(56) References Cited

FOREIGN PATENT DOCUMENTS

| | | | |
|---|---|---|---|
| JP | 2008-171891 A | 7/2008 |
| JP | 2008-181975 A | 8/2008 |
| JP | 2008-277523 A | 11/2008 |
| JP | 2011-082220 A | 4/2011 |
| JP | 2011-086852 A | 4/2011 |
| JP | 2012-004171 A | 1/2012 |
| JP | 2012-028674 A | 2/2012 |

OTHER PUBLICATIONS

Notification of Transmittal of Translation of the International Preliminary Report on Patentability and Translation of Written Opinion of the International Searching Authority; PCT/JP2012/054294 issued on Sep. 4, 2014.

An Office Action; "Notification of Reason for Rejection," issued by the Japanese Patent Office on Aug. 18, 2015, which corresponds to Japanese Patent Application No. 2014-500799 and is related to U.S. Appl. No. 14/359,042; with English language partial translation.

\* cited by examiner

SEMICONDUCTOR DEVICE HAVING A SEMICONDUCTOR ELEMENT AND A TERMINAL CONNECTED TO THE SEMICONDUCTOR ELEMENT

BACKGROUND OF THE INVENTION

1. Field of the Invention

The present invention relates to a semiconductor device used for high current switching or the like.

2. Background Art

Patent Literature 1 discloses a semiconductor device with a contact electrode formed on a semiconductor element. The semiconductor element partially includes an unworked part where no element is formed. Since the unworked part is a non-current-carrying region, it does not generate heat. The semiconductor device disclosed in Patent Literature 1 restricts a maximum temperature of the semiconductor device by providing the unworked part that does not generate heat in a part of the semiconductor element.

PRIOR ART

Patent Literature

Patent Literature 1: Japanese Patent Laid-Open No. 2008-277523

DISCLOSURE OF THE INVENTION

Problems to be Solved by the Invention

A technique of soldering a terminal to a surface electrode of a semiconductor element is called "direct lead bonding." When the surface electrode and the terminal are connected using one large-sized solder, stress increases during thermal contraction, and therefore the surface electrode and the terminal may be connected using a plurality of solders. In this case, during operation of the semiconductor device, there is a problem that a temperature in a semiconductor element region sandwiched between one solder and another solder rises. To prevent the temperature rise in the semiconductor element, it is necessary to limit the operation of the semiconductor device.

The present invention has been implemented to solve the above-described problem and it is an object of the present invention to provide a semiconductor device that connects a surface electrode and a terminal using a plurality of solders and can prevent a temperature rise of a semiconductor element.

Means for Solving the Problems

A semiconductor device in accordance with the present application includes a semiconductor element provided with a plurality of gates linearly formed in a plan view, an emitter pattern insulated from the plurality of gates and an emitter electrode formed on the emitter pattern, the semiconductor element being formed in such a way that a main current flows into the emitter electrode via the emitter pattern, a first solder formed on a part of the emitter electrode, a second solder formed on a part of the emitter electrode apart from the first solder, and a terminal connected to the emitter electrode by means of the first solder and the second solder, wherein the semiconductor element includes a first solder region in which the first solder is formed, a second solder region in which the second solder is formed and an intermediate region which is a region between the first solder region and the second solder region, a density of the gates in the first solder region, a density of the gates in the second solder region and a density of the gates in the intermediate region are equal to each other, and the semiconductor element is formed so that a current density of the main current in the intermediate region is lower than current densities of the main currents in the first solder region and the second solder region.

Other features of the present invention will be described more specifically below.

Advantageous Effects of Invention

The present invention reduces the main current in the intermediate region which is the region of the semiconductor element sandwiched between the regions in which the solders are formed, and can thereby prevent a temperature rise of the semiconductor element.

DESCRIPTION OF EMBODIMENTS

Hereinafter, a semiconductor device according to embodiments of the present invention will be described with reference to the accompanying drawings. The same or corresponding components will be assigned the same reference numerals and duplicate description may be omitted.

Embodiment 1

Figure 1:
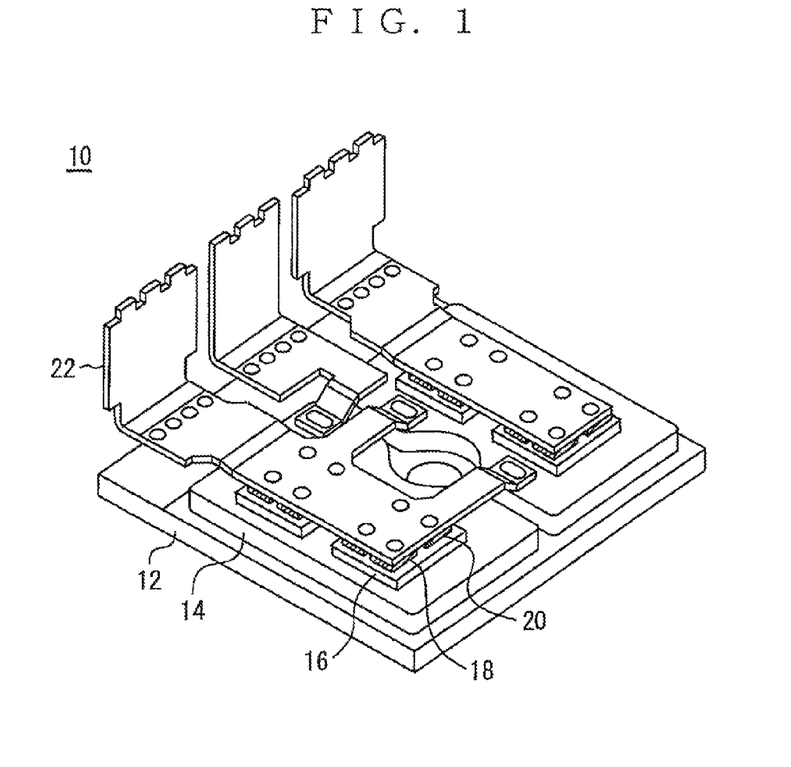
FIG. 1 is a perspective view of a semiconductor device according to Embodiment 1 of the present invention.

FIG. 1 is a perspective view of a semiconductor device according to Embodiment 1 of the present invention. A semiconductor device 10 has a base plate 14 formed on a substrate 12. A semiconductor element 16 is fixed to the base plate 14. The semiconductor element 16 is, for example, a vertical IGBT made of Si. Four solders are formed, provided separately on a surface of the semiconductor element 16. A first solder 18 and a second solder 20 are included in the four solders. A terminal 22 and the semiconductor element 16 are connected together by means of these four solders.

Figure 2:
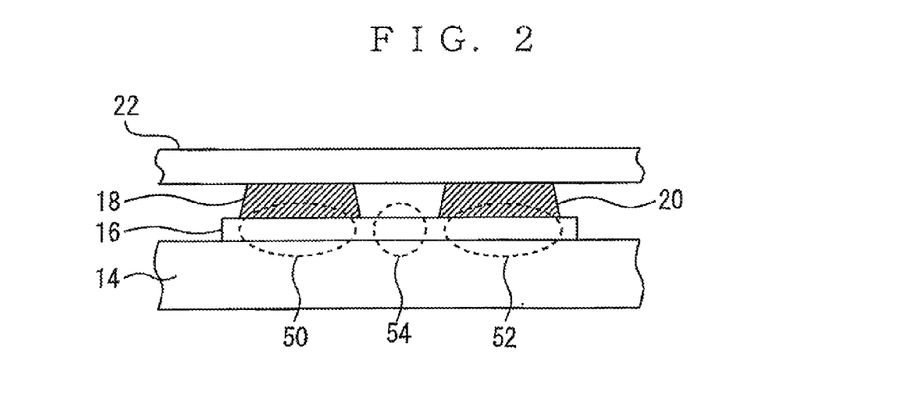
FIG. 2 is a cross-sectional view of a part of the semiconductor device in FIG. 1 including the first solder and the second solder.

FIG. 2 is a cross-sectional view of a part of the semiconductor device 10 in FIG. 1 including the first solder 18 and the second solder 20. The semiconductor element 16 includes a first solder region 50 in which the first solder 16 is formed, a second solder region 52 in which the second solder 20 is formed and an intermediate region 54 which is a region between the first solder region 50 and the second solder region 52.

Figure 3:
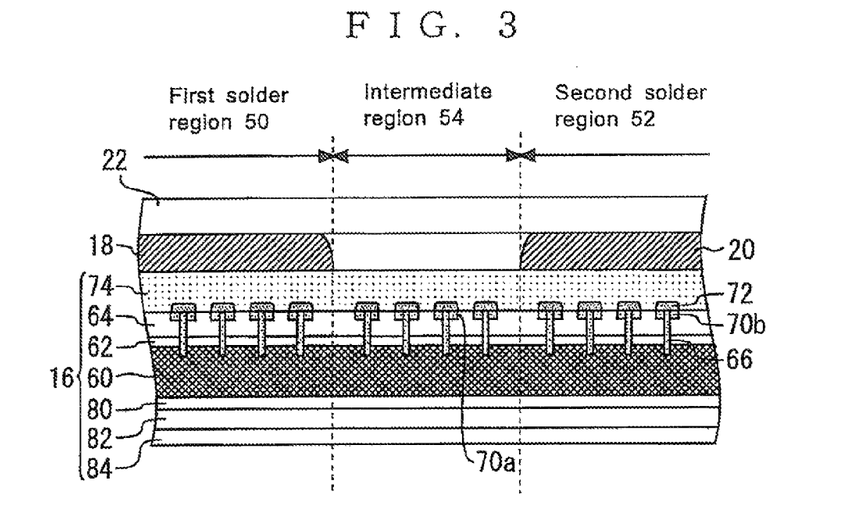
FIG. 3 is a cross-sectional view showing details of the semiconductor element in FIG. 2.

FIG. 3 is a cross-sectional view showing details of the semiconductor element in FIG. 2. The semiconductor element 16 includes an n⁻ layer 60. A charge storage layer 62 is formed on the n⁻ layer 60. A base layer 64 is formed on the charge storage layer 62.

Figure 10:
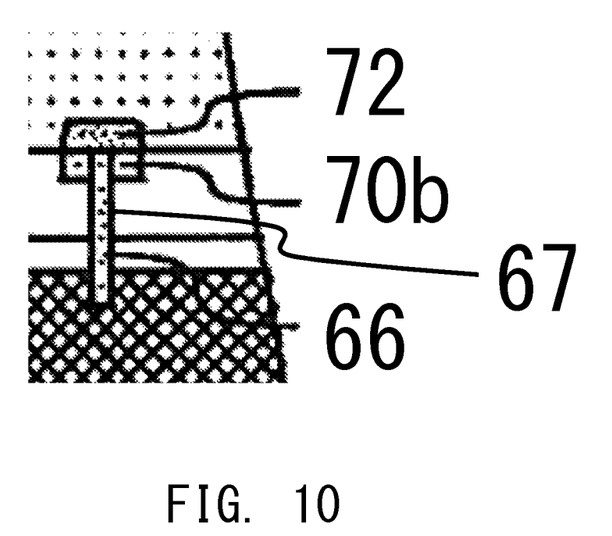
FIG. 10 is a cross-sectional view showing details of a gate and emitter patterns of the semiconductor element in FIG. 3.

A gate 66 is formed so as to penetrate the base layer 64 and the charge storage layer 62 and reach the n⁻ layer 60. The gate 66 is in contact with the base layer 64 via a gate insulating film. Applying a voltage to the gate 66 allows a conductivity type of the base layer 64 to be reversed. Emitter patterns 70a and 70b are formed so as to sandwich the gate 66. The gate 66 and the emitter patterns 70a and 70b are insulated from each other, for example, with gate insulation film 67 formed on the side and bottom surfaces of the gate 66 (see, FIG. 10). An insulating film 72 is formed on the gate 66. An emitter electrode 74 is formed on the emitter patterns 70a and 70b.

A buffer layer 80 is formed below the n⁻ layer 60. A collector layer 82 is formed below the buffer layer 80. The buffer layer 80 is formed to adjust the amount of positive holes injected from the collector layer 82 into the n⁻ layer 60. A collector electrode 84 is formed below the collector layer 82. As described above, the semiconductor element 16 is formed of the vertical IGBT with the emitter electrode 74 formed on the surface thereof and the collector electrode 84 formed on the underside thereof.

The first solder 18 is formed on a part of the emitter electrode 74. The second solder 20 is formed on a part of the emitter electrode 74 apart from the first solder 18. The terminal 22 is connected to the emitter electrode 74 by means of the first solder 18 and the second solder 20. A main current of the semiconductor element 16 flows into the emitter electrode 74 via the emitter patterns 70a and 70b.

Figure 4:
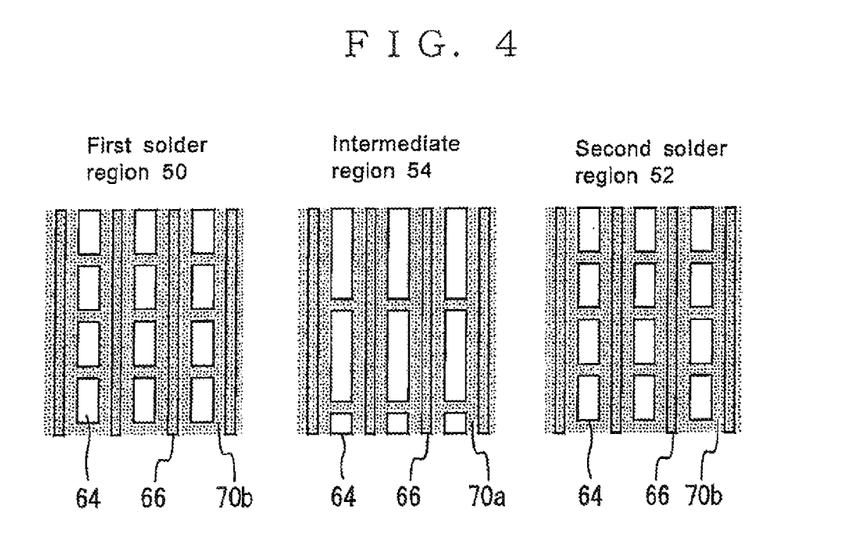
FIG. 4 shows plan views of the gate, emitter pattern and base layer in the first solder region, the second solder region and the intermediate region.

FIG. 4 shows plan views of the gate, emitter pattern and base layer in the first solder region, the second solder region and the intermediate region. A plurality of gates 66 are formed in each region and formed linearly in a plan view. The gates 66 are arranged in parallel at the same interval in all regions of the first solder region 50, the second solder region 52 and the intermediate region 54. Thus, the density of the gates 66 in the first solder region 50, the density of the gates 66 in the second solder region 52 and the density of the gates 66 in the intermediate region 54 are equal to each other.

The emitter pattern 70a in the intermediate region 54 is formed so as to have a smaller area than the emitter patterns 70b in the first solder region 50 and the second solder region 52. Thus, the area of contact per unit area between the emitter pattern and the emitter electrode in a plan view is smaller in the intermediate region 54 than in the first solder region 50 and the second solder region 52.

According to the semiconductor device according to Embodiment 1 of the present invention, since the emitter pattern 70a in the intermediate region 54 is formed to be smaller, making it harder for a current to flow through the intermediate region 54 than through the first solder region 50 and the second solder region 52, and it is thereby possible to prevent a temperature rise between the solders (in the intermediate region). Note that it is also possible to prevent a temperature rise in the intermediate region by not forming any gate in the intermediate region or preventing the gates in the intermediate region from functioning. In this case, the intermediate region may become an invalid region which does not contribute to the operation of the semiconductor element. However, according to the semiconductor device 10 according to Embodiment 1 of the present invention, it is possible to cause a current to flow into the intermediate region 54, cause the intermediate region 54 to contribute to the operation of the semiconductor element 16, reduce the current that flows through the intermediate region 54 and prevent a temperature rise in the intermediate region 54.

In the semiconductor device 10 according to Embodiment 1 of the present invention, the emitter pattern 70a in the intermediate region 54 is formed to be smaller than the emitter pattern 70b in the first solder region 50 and the emitter pattern 70b in the second solder region 52, but the present invention is not limited to this. That is, the effect of the present invention can be achieved if the semiconductor element 16 is formed so that the current density of the main current in the intermediate region 54 is lower than the current densities of the main currents in the first solder region 50 and the second solder region 52, and therefore various modifications can be made within the scope of not losing this feature.

Although the semiconductor element 16 according to Embodiment 1 of the present invention is formed of Si, the semiconductor element 16 may also be formed of a wide-band gap semiconductor having a greater band gap than Si. The wide-band gap semiconductor is, for example, silicon carbide, nitride gallium-based material or diamond. Furthermore, the semiconductor element 16 is not limited to the vertical IGBT, but may be formed of, for example, MOSFET. Moreover, the conductivity type of each part of the semiconductor element may be reversed as appropriate.

Embodiment 2

Figure 5:
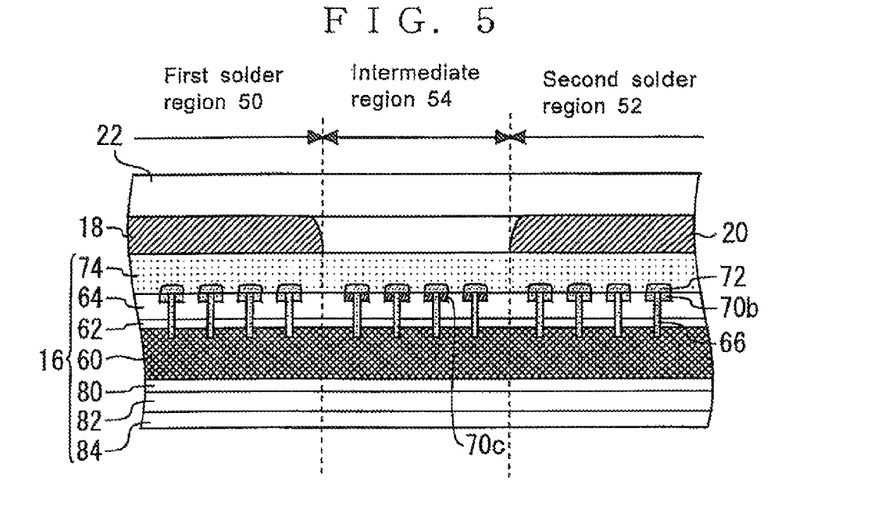
FIG. 5 is a cross-sectional view of a semiconductor device according to Embodiment 2 of the present invention.

FIG. 5 is a cross-sectional view of a semiconductor device according to Embodiment 2 of the present invention. Description will be focused on differences from the semiconductor device according to Embodiment 1.

An impurity density of an emitter pattern 70c in the intermediate region 54 is lower than the impurity density of the emitter pattern 70b in the first solder region 50 and the impurity density of the emitter pattern 70b in the second solder region 52. Here, the impurity density refers to a donor density. Note that the donor density may also be an effective donor density.

The semiconductor device according to Embodiment 2 of the present invention allows the current density of the main current in the intermediate region 54 to be lower than the current densities of the main currents in the first solder region 50 and the second solder region 52. It is thereby possible to prevent a temperature rise between the solders (in the intermediate region).

Embodiment 3

Figure 6:
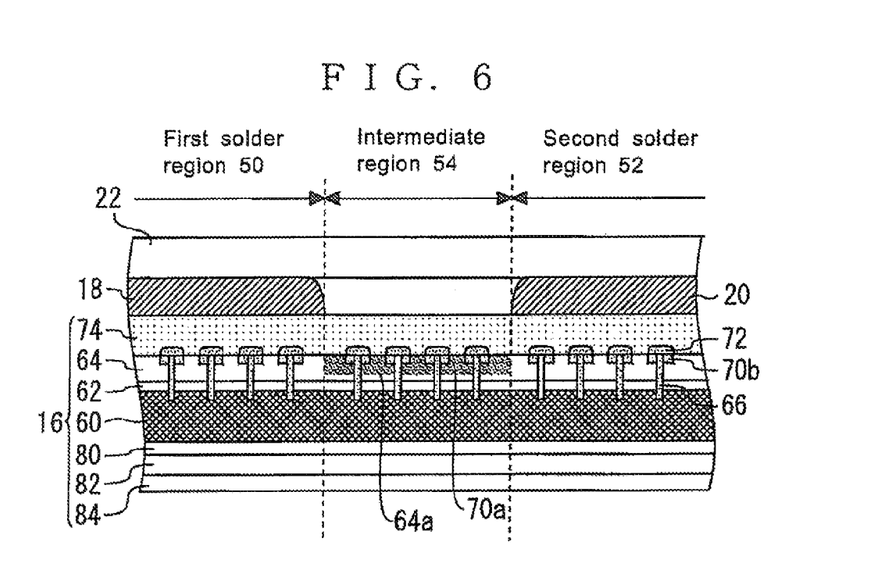
FIG. 6 is a cross-sectional view of a semiconductor device according to Embodiment 3 of the present invention.

FIG. 6 is a cross-sectional view of a semiconductor device according to Embodiment 3 of the present invention. Description will be focused on differences from the semiconductor device according to Embodiment 1.

An impurity density of a base layer 64a in the intermediate region 54 is higher than the impurity density of the base layer 64 in the first solder region 50 and the impurity density of the base layer 64 in the second solder region 52. Here, the impurity density refers to an acceptor density. The acceptor density may also be an effective acceptor density.

The semiconductor device according to Embodiment 3 of the present invention can increase a gate threshold voltage in the intermediate region 54 and make the current density of the main current in the intermediate region 54 lower than the current densities of the main currents in the first solder region 50 and the second solder region 52. It is thereby possible to prevent a temperature rise between the solders (in the intermediate region).

Embodiment 4

Figure 7:
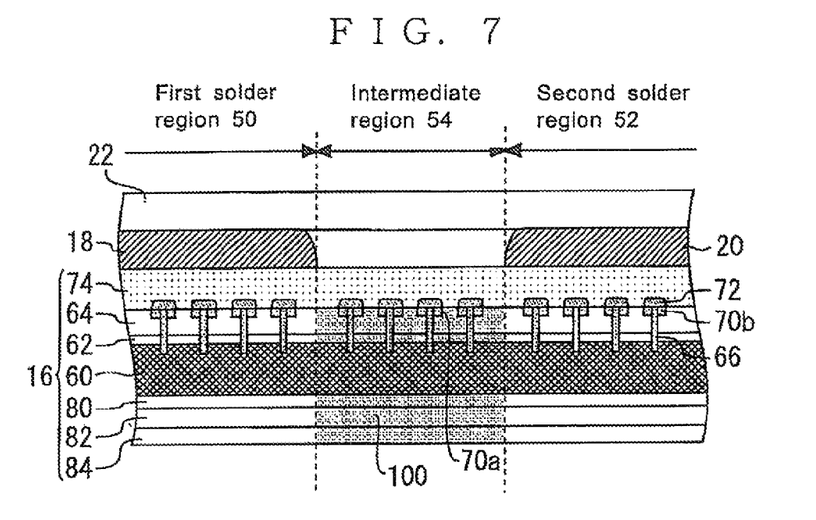
FIG. 7 is a cross-sectional view of a semiconductor device according to Embodiment 4 of the present invention.

FIG. 7 is a cross-sectional view of a semiconductor device according to Embodiment 4 of the present invention. Description will be focused on differences from the semiconductor device according to Embodiment 1.

A charged particle radiation region 100 is formed in the intermediate region 54 by radiating charged particles such as electron beams. Because of the formation of the charged particle radiation region 100, the path of the main current in the intermediate region 54 contains more lattice defects than the paths of the main currents in the first solder region 50 and the second solder region 52.

A lattice defect has a function of recoupling electrons and positive hole carriers in a semiconductor material, and it is thereby possible to control a carrier life time by optimizing a lattice defect density. The semiconductor device according to Embodiment 4 of the present invention introduces lattice defects into the intermediate region 54, controls the carrier life time in the intermediate region 54, and can thereby increase an ON-voltage of the intermediate region 54. It is thereby possible to make the current density of the main current in the intermediate region 54 lower than the current densities of the main currents in the first solder region 50 and the second solder region 52, and prevent a temperature rise between the solders (in the intermediate region).

Embodiment 5

Figure 8:
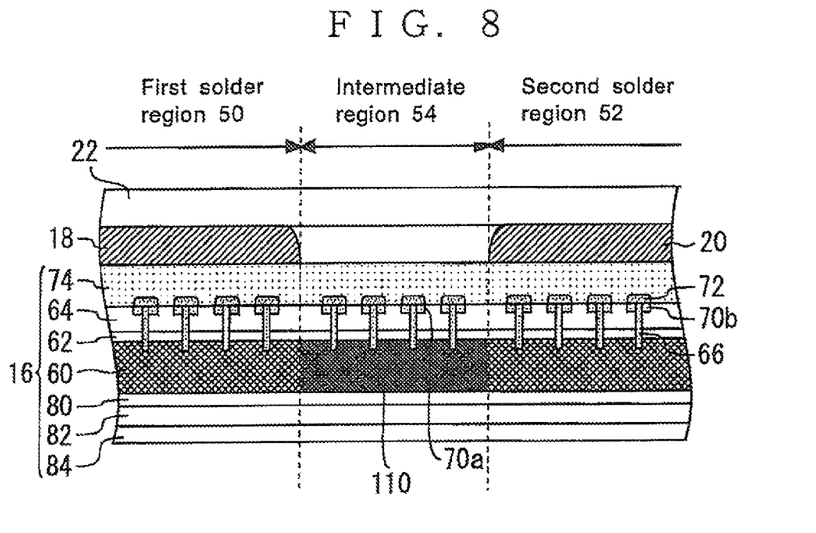
FIG. 8 is a cross-sectional view of a semiconductor device according to Embodiment 5 of the present invention.

FIG. 8 is a cross-sectional view of a semiconductor device according to Embodiment 5 of the present invention. Description will be focused on differences from the semiconductor device according to Embodiment 1.

A specific resistance of an $n^-$ layer 110 in the intermediate region 54 is higher than specific resistances of the $n^-$ layers 60 in the first solder region 50 and the second solder region 52. Therefore, the specific resistance of the main current path in the intermediate region 54 is higher than the specific resistance of the main current path in the first solder region 50 and the specific resistance of the main current path in the second solder region 52.

The semiconductor device according to Embodiment 5 of the present invention can increase the ON voltage of the intermediate region 54. Thus, it is possible to make the current density of the main current in the intermediate region 54 lower than the current densities of the main currents in the first solder region 50 and the second solder region 52, and prevent a temperature rise between the solders (in the intermediate region).

Embodiment 6

Figure 9:
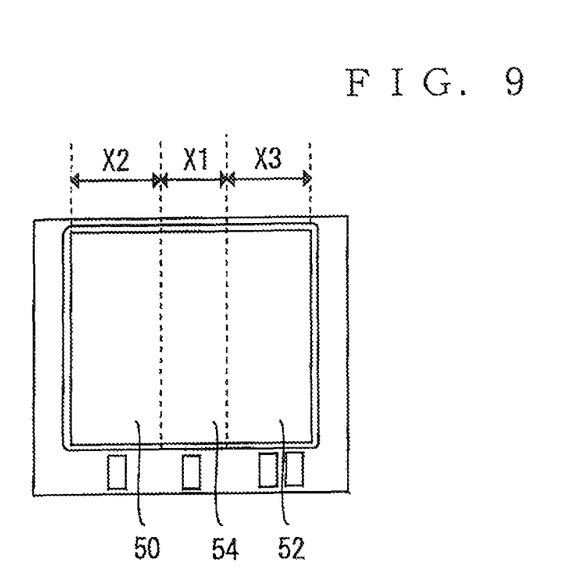
FIG. 9 is a cross-sectional view of a semiconductor element according to Embodiment 6 of the present invention.

FIG. 9 is a cross-sectional view of a semiconductor element according to Embodiment 6 of the present invention. Description will be focused on differences from the semiconductor device according to Embodiment 1.

A width (X1) of the intermediate region 54 is set to be a half or more of a width (X2) of the first solder region 50 or a width (X3) of the second solder region 52. Keeping a sufficient distance between the first solder region 50 and the second solder region 52 prevents the heat generated in the first solder region 50 and the heat generated in the second solder region 52 from interfering with each other. It is thereby possible to prevent a temperature rise between the solders (in the intermediate region).

The width X1 is not particularly limited if it is a half or more of the width X2 or width X3. Note that the semiconductor devices according to Embodiments 2 to 6 of the present invention can be modified on the same level with at least Embodiment 1. Moreover, the features of the semiconductor devices according to the respective embodiments may be combined as appropriate.

DESCRIPTION OF REFERENCE NUMERALS 10 semiconductor device, 12 substrate, 14 base plate, 16 semiconductor element, 22 terminal, 50 first solder region, 52 second solder region, 54 intermediate region, 60 $n^-$ layer, 62 charge storage region, 64,64a base layer, 66 gate, 70a,70b, 70c emitter pattern, 72 insulating film, 74 emitter electrode, 80 buffer layer, 82 collector layer, 84 collector electrode, 100 charged particle radiation region, 110 $n^-$ layer

What is claimed is:

1. A semiconductor device comprising:
a semiconductor element provided with a plurality of gates linearly formed in a plan view, an emitter pattern insulated from the plurality of gates and an emitter electrode formed on the emitter pattern, the semiconductor element being formed in such a way that a main current flows into the emitter electrode via the emitter pattern;
a first solder formed on a part of the emitter electrode;
a second solder formed on a part of the emitter electrode apart from the first solder; and
a terminal connected to the emitter electrode by means of the first solder and the second solder, wherein
the semiconductor element comprises a first solder region in which the first solder is formed, a second solder region in which the second solder is formed and an intermediate region which is a region between the first solder region and the second solder region,
a density of the plurality of gates in the first solder region, a density of the plurality of gates in the second solder region and a density of the plurality of gates in the intermediate region are equal to each other, and
the semiconductor element is formed so that a current density of the main current in the intermediate region is lower than current densities of the main current in the first solder region and the second solder region.

2. The semiconductor device according to claim 1, wherein an area of contact per unit area between the emitter pattern and the emitter electrode in a plan view is smaller in the intermediate region than in the first solder region and the second solder region.

3. The semiconductor device according to claim 1, wherein an impurity density of the emitter pattern in the intermediate region is lower than an impurity density of the emitter pattern in the first solder region and an impurity density of the emitter pattern in the second solder region.

4. The semiconductor device according to claim 1, further comprising a base layer which is formed in contact with the plurality of gates and whose conductivity type is reversed when a voltage is applied to the plurality of gates, wherein
an impurity density of the base layer in the intermediate region is higher than an impurity density of the base layer in the first solder region and an impurity density of the base layer in the second solder region.

5. The semiconductor device according to claim 1, wherein a path of the main current in the intermediate region contains more lattice defects than paths of the main current in the first solder region and the second solder region.

6. The semiconductor device according to claim 1, wherein a specific resistance of a path of the main current in the intermediate region is higher than a specific resistance of a path of the main current in the first solder region and a specific resistance of a path of the main current in the second solder region.

7. The semiconductor device according to claim 1, wherein a width of the intermediate region is a half or more of a width of the first solder region or the second solder region.

8. The semiconductor device according to claim 1, wherein the semiconductor element is a vertical IGBT with the emitter electrode formed on a surface thereof and a collector electrode formed on an underside thereof.

9. The semiconductor device according to claim 1, wherein the semiconductor element is formed of a wide-band gap semiconductor.

10. The semiconductor device according to claim 9, wherein the wide-band gap semiconductor is a silicon carbide or nitride gallium based material or diamond.

* * * * *